(12) United States Patent
Wong et al.

(10) Patent No.: US 9,099,363 B1
(45) Date of Patent: Aug. 4, 2015

(54) SUBSTRATE WITH CORNER CUT-OUTS AND SEMICONDUCTOR DEVICE ASSEMBLED THEREWITH

(71) Applicants: Wai Keong Wong, Shah Alam (MY); Yi Mei Leow, Petaling Jaya (MY); Lan Yit Ong, Selangor (MY)

(72) Inventors: Wai Keong Wong, Shah Alam (MY); Yi Mei Leow, Petaling Jaya (MY); Lan Yit Ong, Selangor (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/178,294

(22) Filed: Feb. 12, 2014

(51) Int. Cl.
*H01L 23/42* (2006.01)
*H01L 23/00* (2006.01)
*H01L 21/56* (2006.01)

(52) U.S. Cl.
CPC .............. *H01L 24/14* (2013.01); *H01L 21/56* (2013.03); *H01L 24/83* (2013.01); *H01L 2924/1515* (2013.01); *H01L 2924/15311* (2013.01); *H01L 2924/1815* (2013.01)

(58) Field of Classification Search
USPC ................ 257/685, 778, 670, 730, 773, 787, 257/E23.037, E23.116, E21.499, E21.502; 438/108, 106, 107, 110, 127
See application file for complete search history.

(56) References Cited

U.S. PATENT DOCUMENTS

| | | | |
|---|---|---|---|
| 4,935,581 A | 6/1990 | Komathu | |
| 5,136,366 A | 8/1992 | Worp | |
| 5,557,150 A | 9/1996 | Variot | |
| 5,834,843 A * | 11/1998 | Mori et al. | 257/723 |
| 6,011,301 A | 1/2000 | Chiu | |
| 6,220,870 B1 | 4/2001 | Barabi | |
| 7,199,306 B2 | 4/2007 | Owens | |
| 7,384,805 B2 | 6/2008 | Kinsman | |
| 7,927,927 B2 | 4/2011 | Quan | |
| 8,254,134 B2 | 8/2012 | Hiew | |
| 8,361,598 B2 | 1/2013 | Daubenspeck | |
| 2010/0025863 A1* | 2/2010 | Gruber et al. | 257/778 |

* cited by examiner

*Primary Examiner* — Jasmine Clark
(74) *Attorney, Agent, or Firm* — Charles Bergere

(57) ABSTRACT

A semiconductor device is assembled from a rectangular substrate sheet. The substrate sheet has die mounting pads accessible from a first side and package mounting pads accessible from an opposite side. Corner regions of the substrate sheet have receding edges. A semiconductor die is attached to the substrate sheet such that electrodes or bonding pads of the die are mounted to respective die mounting pads of the substrate sheet. An encapsulating material covers the semiconductor die and the first side of the substrate sheet. Corner covering sections of the encapsulating material further cover the receding edges of the corner regions.

19 Claims, 9 Drawing Sheets

SUBSTRATE WITH CORNER CUT-OUTS AND SEMICONDUCTOR DEVICE ASSEMBLED THEREWITH

BACKGROUND OF THE INVENTION

The present invention relates generally to semiconductor devices and, more particularly, to a semiconductor device assembled with a lead frame having corner cut-outs.

Integrated circuit or semiconductor dies are packaged in order to protect the dies. The package provides external electrical connections (as well as physical protection) to the die. Continued progress in reduction of the size of the semiconductor dies and increased functionality and complexity of the integrated circuits formed on the dies requires size reduction of the packaging with the same or greater complexity of the electrical connections with external circuits.

One typical type of package is a Quad Flat Pack (QFP), which is formed with a semiconductor die mounted to a lead frame. The lead frame is formed from a sheet of metal (e.g., copper) that includes a die attach pad often called a flag and arms that attach the flag to a frame. Leads or lead fingers of the lead frame are electrically connected to electrodes of the die (die bond pads) with bond wires. The lead fingers provide a means of easily electrically connecting the die to circuit boards and the like. After the electrodes and lead fingers pads are electrically connected, the semiconductor die, the bond wires and portions of the lead fingers are encapsulated in a compound (material) such as a plastic material leaving only sections of the leads exposed. The exposed leads are cut from the frame of the lead-frame (singulated) and bent for ease of connection to a circuit board. However, the inherent structure of QFP packages results in limiting the number of leads, and therefore the number of package external electrical connections, that can be used for a specific QFP package size. Further, the external electrical connections of lead frame based grid array packages are typically fabricated from a thin single sheet of conductive material, such as copper or aluminium, and these connections may not be sufficiently held within the encapsulating compound (material) and can become loose.

Grid array packages have been developed as an alternative to QFP packages. Grid array packages normally include a rectangular substrate sheet having die mounting pads accessible from a first side and package mounting pads accessible from an opposite side. A semiconductor die is attached to the substrate sheet so that the die electrodes are mounted to the die mounting pads and an encapsulating material covers the semiconductor die and the first side of the substrate sheet. This type of package may be susceptible to stress at corner regions of the substrate sheet especially during assembly and testing. Consequently, fractures and cracks can occur in the corner regions resulting in a defective package. It would be advantageous to have a substrate or lead frame for a package that allows for better adhesion of the mold compound to the substrate and prevents cracking of the package/substrate body.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
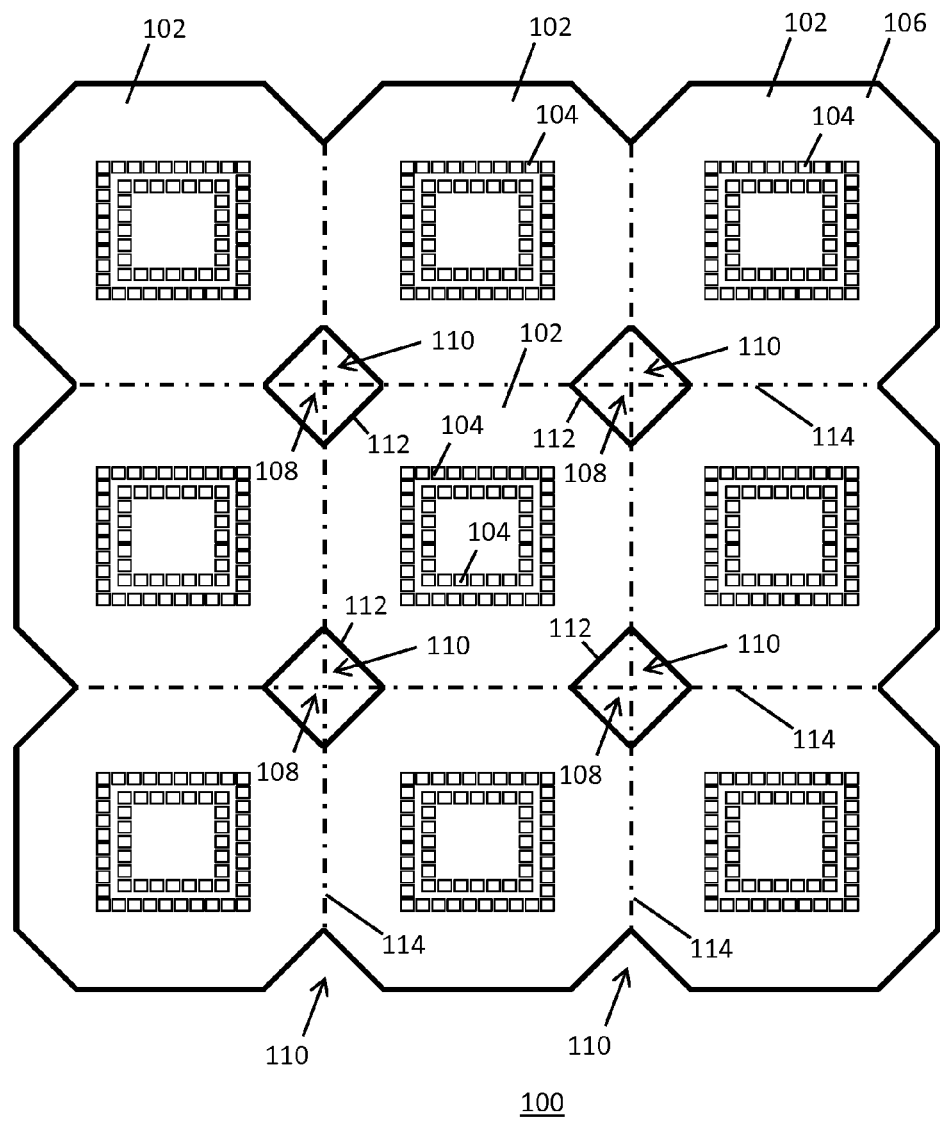
FIG. 1 is a plan view of an apertured sheet having an array of identical substantially rectangular substrate sheets according to a first embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Further, the terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step. As used herein, the phrase semiconductor device refers to a packaged semiconductor die.

In one embodiment, the present invention provides a semiconductor device comprising a substantially rectangular substrate sheet. The substrate sheet has die mounting pads accessible from a first side and package mounting pads accessible from an opposite side. Each corner region of the substrate sheet has a receding edge. A semiconductor die is attached to the substrate sheet. Electrodes or bond pads of the die are mounted to respective mounting pads of the substrate sheet. An encapsulating material covers both the semiconductor die and the first side of the substrate sheet. Corner covering sections of the encapsulating material further cover the receding edges of each corner regions.

In another embodiment, the present invention provides a method of assembling a semiconductor device. The method includes providing an apertured sheet having an array of identical substantially rectangular substrate sheets. Each of the substrate sheets has die mounting pads accessible from a first side and package mounting pads accessible from an opposite side. Also, adjacent corner regions of the substrate sheets have apertures that form corner region receding edges for each of the respective substrate sheets. The method also includes attaching a respective semiconductor die to each of the substrate sheets such that electrodes or bonding pads of the die are mounted to respective die mounting pads. The method also includes encapsulating the die and the first side of the substrate sheet with a mold compound. The mold compound fills the apertures to provide corner covering sections of the mold material that further cover the receding edges of the corner regions.

Referring now to FIG. 1, a plan view of an apertured sheet 100 having an array of identical substantially rectangular substrate sheets 102 according to a first embodiment of the present invention is shown. Each of the substrate sheets 102 has die mounting pads 104 accessible from a first side 106, and adjacent corner regions 108 that form apertures 110 in the substrate sheets 102. As shown, the apertures 110 form a corner region receding edge 112 for each of the respective substrate sheets 102. For illustration purposes only there are nine substantially rectangular substrate sheets 102 forming the apertured sheet 100, however, the apertured sheet 100 typically has many more than the nine substrate sheets 102. Also shown are hypothetical singulation lines 114 along which the apertured sheet 100 is cut during assembly of semiconductor devices for which the substrate sheets 102 form a support and interconnect base.

Figure 2:
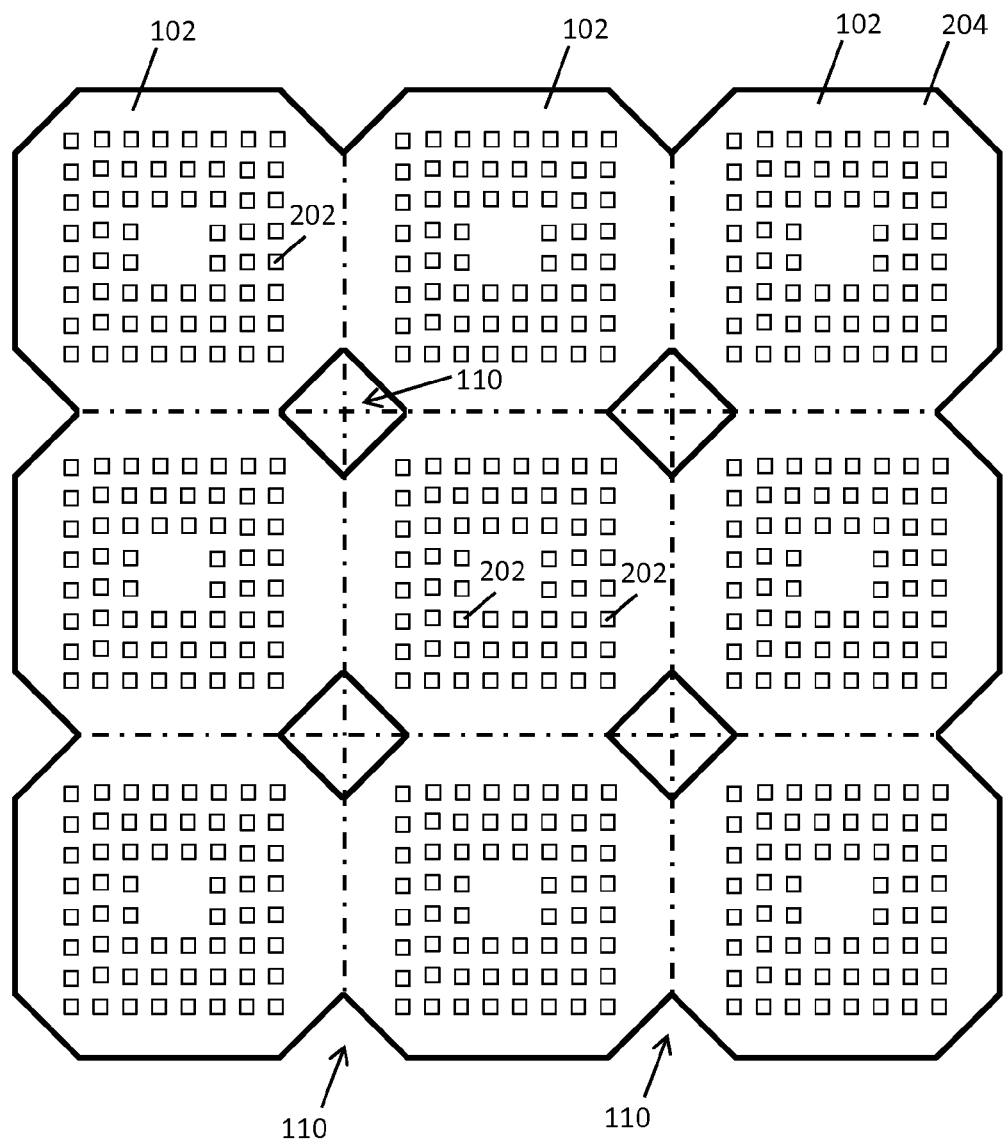
FIG. 2 is an underside plan view of the apertured sheet of FIG. 1.

FIG. 2 illustrates an underside plan view of the apertured sheet 100. As shown, each of the substrate sheets 102 has package mounting pads 202 accessible from an opposite side 204 relative to the first side 106. Also, each of the package mounting pads 202 are electrically coupled to a respective one of the die mounting pads 104 typically by metal traces and/or vias as will be apparent to a person skilled in the art.

Figure 3:
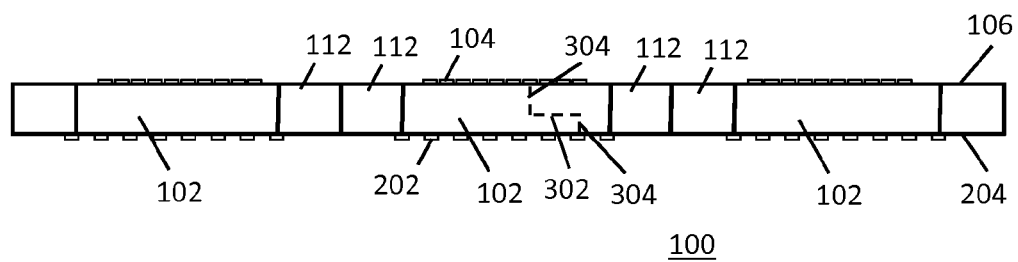
FIG. 3 is a side view of the apertured sheet of FIG. 1.

FIG. 3 illustrates a side view of the apertured sheet 100. In this illustration, a trace 302 and vias 304 that connect one of the package mounting pads 202 to one of the die mounting pads 104 is shown in phantom.

Figure 4:
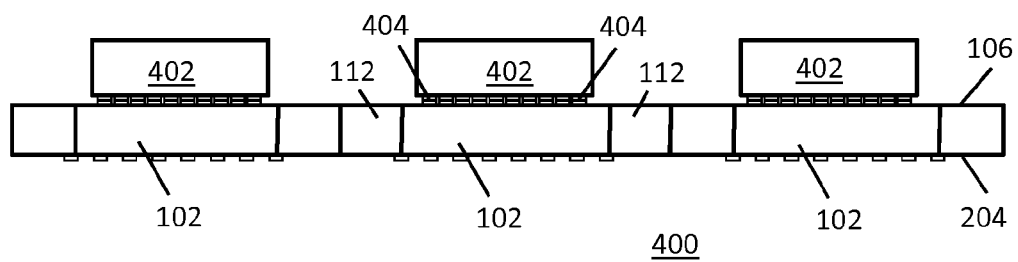
FIG. 4 is a side view of a partially assembled package, formed from the apertured sheet of FIG. 1, in accordance with the first preferred embodiment of the present invention.

FIG. 4 is a side view of a partially assembled package or semiconductor device 400, formed from the apertured sheet 100, in accordance with the first preferred embodiment of the present invention. The partially assembled package 400 includes a respective semiconductor die 402 mounted to each of the substrate sheets 102. Each semiconductor die 402 is attached to its respective substrate sheet 102 so that external die electrodes or bond pads 404 of the die 402 are mounted to respective ones of the die mounting pads 104 of the aperture sheet 100. Furthermore, each respective semiconductor die 402 is also secured to its respective substrate sheet 102 with an adhesive such as a bonding epoxy resin or double sided tape, as will be apparent to a person skilled in the art.

Figure 5:
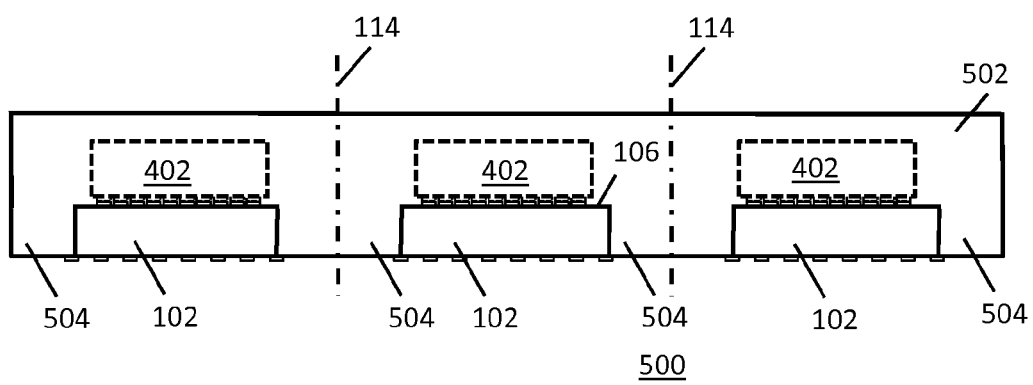
FIG. 5 is a side view of an encapsulated sheet assembly, formed from the partially assembled package of FIG. 4, in accordance with the first preferred embodiment of the present invention.

Referring to FIG. 5, a side view of an encapsulated sheet assembly 500, formed from the partially assembled package 400, in accordance with the first preferred embodiment of the present invention, is shown. The assembly 500 is formed with an encapsulating material 502 that is press molded so that it covers all of the semiconductor dies 402 (shown in phantom) and the first side 106 of the apertured sheet 100. The encapsulating material 502 is typically plastics based and fills the apertures 110 to provide corner covering sections 504 that cover the receding edge 112 of each corner region 108.

Figure 6:
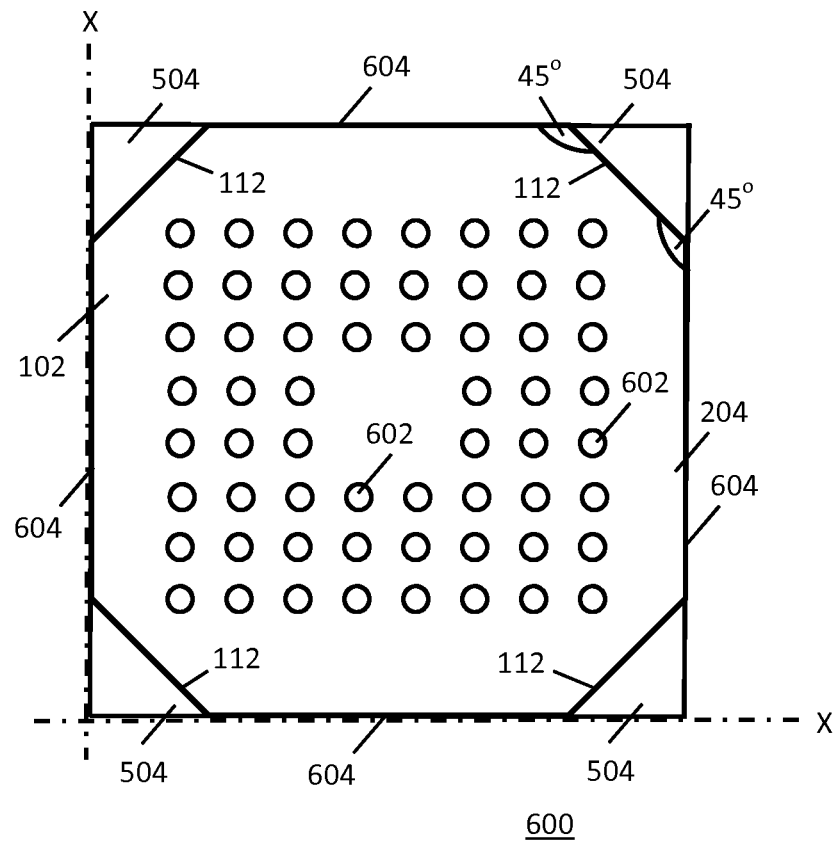
FIG. 6 is an underside plan view of a semiconductor die package, formed from the encapsulated sheet assembly of FIG. 5, in accordance with the first preferred embodiment of the present invention.

FIG. 6 is an underside plan view of a semiconductor device 600, formed from the encapsulated sheet assembly 500, in accordance with the first preferred embodiment of the present invention. The semiconductor device 600 has been singulated, typically by a cutting or sawing process along the singulation lines 114. Also, solder balls 602 are soldered to respective package mounting pads 202, thereby forming a ball grid array (BGA) package, however the package can be any grid array package as will be apparent to a person skilled in the art.

As illustrated by plane lines X, the substrate sheet 102 has substrate sheet edges 604 other than the receding edges 112 that are each coplanar with a respective edge of the encapsulating material 502. Also, each of the receding edges forms a chamfered corner region that is at a 45° angle to adjacent substrate sheet edges 604.

Figure 7:
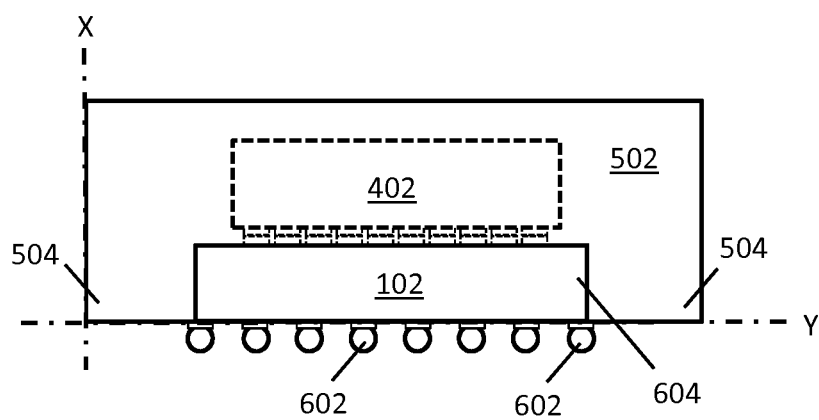
FIG. 7 is a side view of the semiconductor die package of FIG. 6.

FIG. 7 is a side view of the semiconductor device 600. In this embodiment, as illustrated by plane line Y, base regions of the corner covering sections 504 are coplanar with the opposite side 204 of the substrate sheet 102 and the overall outline of the device 600 is rectangular.

Figure 8:
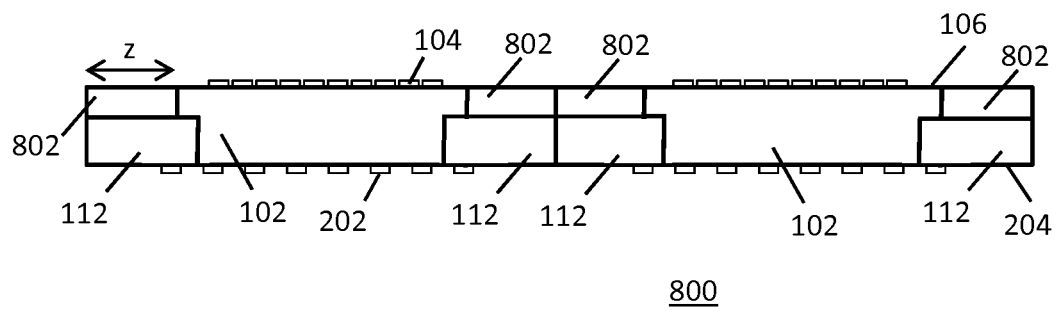
FIG. 8 is a side view of an apertured sheet in accordance with a second preferred embodiment of the present invention.

Referring to FIG. 8, a side view of an apertured sheet 800, in accordance with a second preferred embodiment of the present invention, is shown. The apertured sheet 800 is similar to the apertured sheet 100 and therefore to avoid repetition only the differences will be described. As illustrated, each corner region receding edge 112 has an overhang 802 that extends along a longitudinal axis Z of the receding edge 112. All other features and components of the apertured sheet 800 are identical to that of the apertured sheet 100 and therefore have the same reference numerals.

Figure 9:
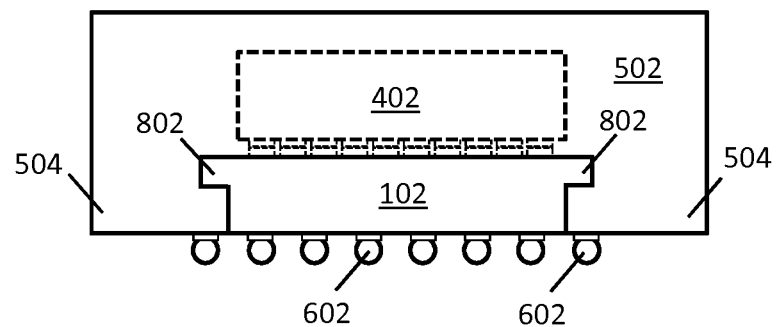
FIG. 9 is a side view of a semiconductor die package, formed from the apertured sheet of FIG. 8, in accordance with the second preferred embodiment of the present invention.

FIG. 9 is a side view of a semiconductor device 900, formed from the apertured sheet 800, in accordance with the second preferred embodiment of the present invention. The semiconductor device 900 is similar to the semiconductor device 600 and therefore to avoid repetition only the differences will be described. As shown, each overhang 802 is covered by a respective corner covering section 504 of the encapsulating material 502, which reduces the possibility of corners of the substrate sheet 102 from being unduly stressed or becoming detached from the encapsulating material 502. All other features and components of the semiconductor device 900 are identical to that of the semiconductor device 600 and therefore have the same reference numerals.

Figure 10:
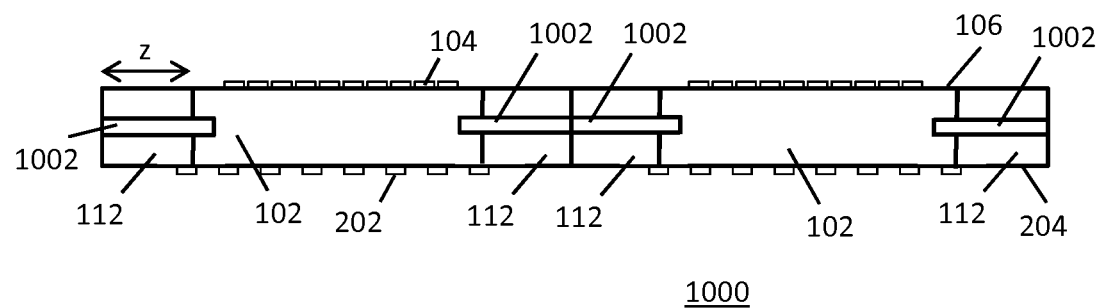
FIG. 10 is a side view of an apertured sheet in accordance with a third preferred embodiment of the present invention.

FIG. 10 is a side view of an apertured sheet 1000 in accordance with a third preferred embodiment of the present invention. The apertured sheet 1000 is similar to the apertured sheet 100 and again to avoid repetition only the differences will be described. As illustrated, each corner region receding edge 112 has a slot 1002 that extends along the longitudinal axis Z of the receding edge 112. All other features and components of the apertured sheet 800 are identical to that of the apertured sheet 100 and therefore have the same reference numerals.

Figure 11:
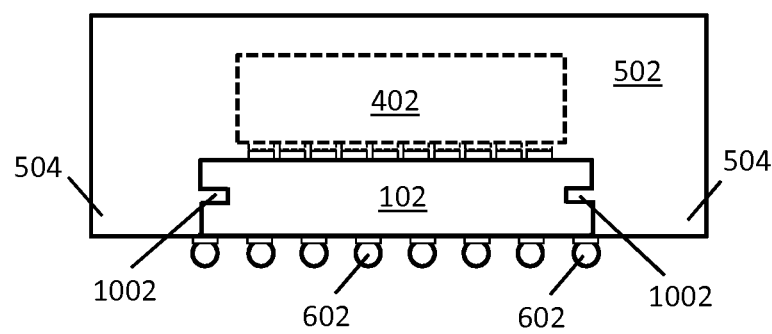
FIG. 11 is a side view of a semiconductor die package, formed from the apertured sheet of FIG. 10, in accordance with the third preferred embodiment of the present invention.

FIG. 11 is a side view of a semiconductor device 1100, formed from the apertured sheet 1000, in accordance with the third preferred embodiment of the present invention. The semiconductor device 1100 is similar to the semiconductor device 600 and therefore to avoid repetition only the differences will be described. As shown, each slot 1002 is filled by a respective corner covering section 504 of the encapsulating material 502, which reduces the possibility of corners of the substrate sheet 102 from being unduly stressed or becoming detached from the encapsulating material 502. All other features and components of the semiconductor device 1100 are identical to that of the semiconductor device 600 and therefore have the same reference numerals.

Figure 12:
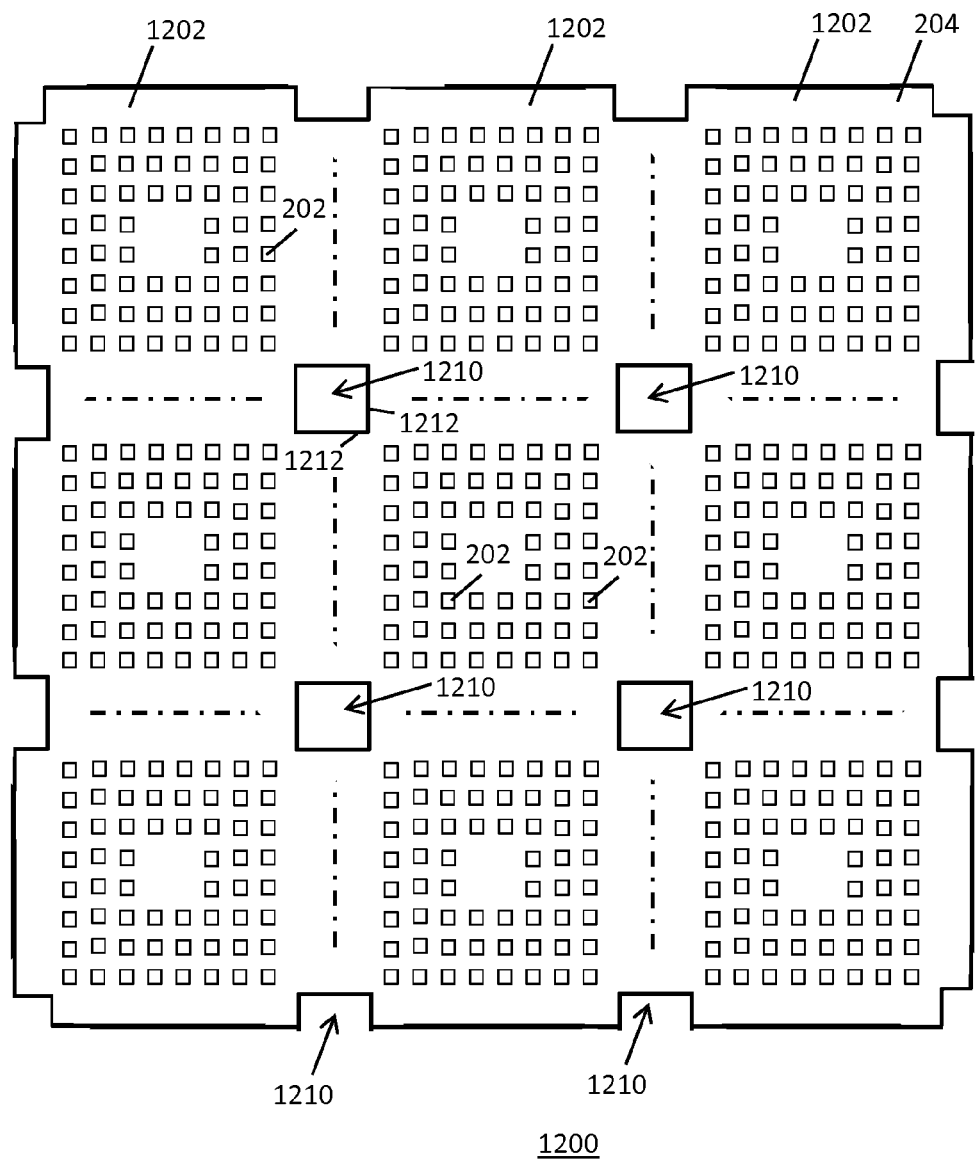
FIG. 12 is a plan view of an apertured sheet having an array of identical substantially rectangular substrate sheets according to a fourth embodiment of the present invention.

Referring to FIG. 12, a plan view of an apertured sheet 1200, comprising an array of identical substantially rectangular substrate sheets 1202, according to a fourth embodiment of the present invention, is shown. The apertured sheet 1200 is similar to the apertured sheet 100 and therefore to avoid repetition only the differences will be described. The shape of the apertures is such that after assembly and singulation of semiconductor devices, with the sheets 1202, the receding edges 1212 have a notched profile when viewed in plan view. These receding edges may also have an overhang or slot as described above.

Figure 13:
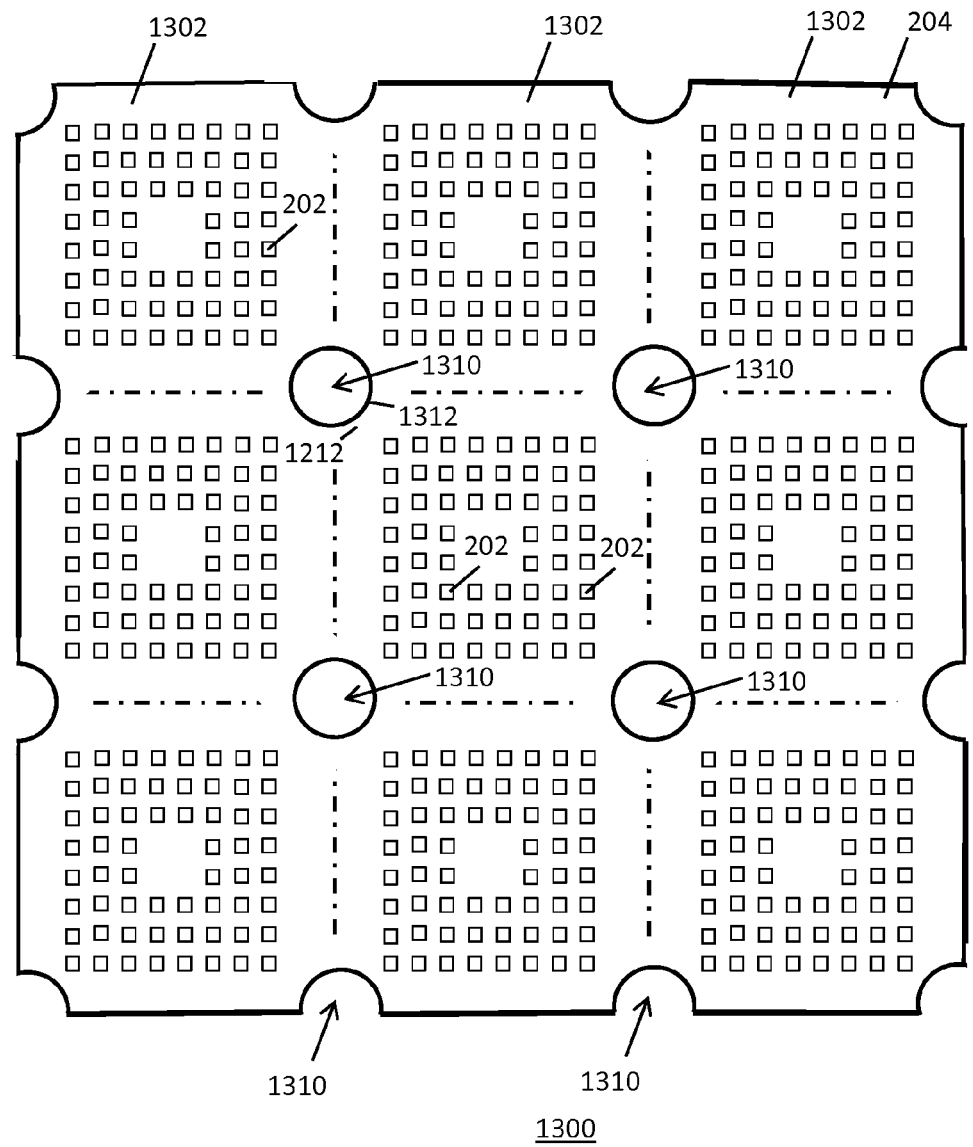
FIG. 13 is a plan view of an apertured sheet having an array of identical substantially rectangular substrate sheets according to a fifth embodiment of the present invention.

FIG. 13 is a plan view of an apertured sheet 1300, comprising an array of identical substantially rectangular substrate sheets 1302, according to a fifth embodiment of the present invention. The apertured sheet 1300 is similar to the apertured sheet 100 and therefore to avoid repetition only the differences will be described. The shape of the apertures is such that after assembly and singulation of semiconductor devices employing the sheets 1302, the receding edges 1312 have a convex arcuate profile when viewed in plan view. The receding edges 1312 may also have an overhang or slot as described above.

In further embodiments the receding edges of the sheets may be a convex arcuate profile when viewed in plan view. This convex arcuate profile may also have an overhang or slot as described above. It will therefore be apparent the present invention can be summarised in one form as the semiconductor device 600 that includes one of the substantially rectangular substrate sheets 102 having die mounting pads 104 accessible from the first side 106 and package mounting pads accessible from opposite side 204. Each corner region of one the substrate sheets 102 is formed by one of the shaped receding edges 112. The semiconductor die 402 is attached to the substrate sheet 102 so that the die electrodes or bonding pads 404 are mounted to the respective die mounting pads 104. The encapsulating material covers both the semiconductor die 102 and the first side of the substrate sheet 106. Additionally, the corner covering sections 504 cover the receding edges 112 to thereby offer protection to the edges 112.

Figure 14:
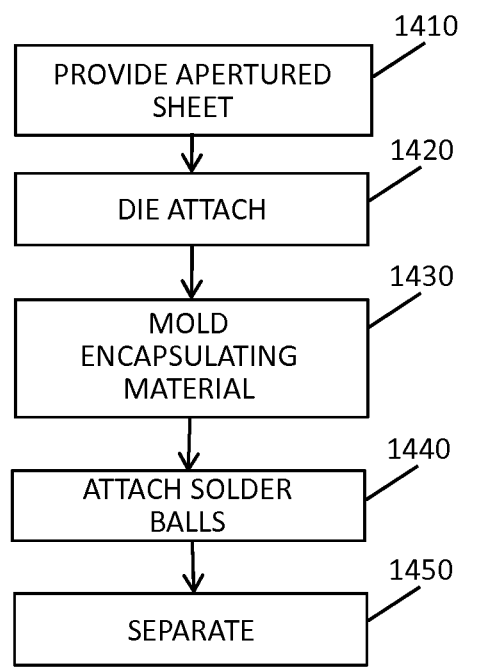
FIG. 14 is flow chart illustrating a method of assembling a semiconductor device in accordance with yet another preferred embodiment of the present invention.

Referring to FIG. 14, a flow chart illustrating a method 1400 of assembling a semiconductor device in accordance with yet another preferred embodiment of the present invention is shown. For illustration purposes only, the method 1400 will be described with reference to the semiconductor die package 600 and at block 1410 there is provided the apertured sheet 100. Next at block 1420 there is performed a process of attaching the respective semiconductor die 402 to each of the substrate sheets 102.

At a moulding block 1430 the method 1400 performs a moulding process such that the encapsulating material 502 covers each semiconductor die 404 and the first side of each substrate sheet 102. The moulding process also ensures that encapsulating material 502 fills the apertures 100 to provide the corner covering sections 504 that further cover the receding edge of each corner region 108. At an attaching block 1440, the solder balls 602 are attached to their respective package mounting pads 202. At a separating block 1450, the substrate sheets and encapsulating material 502 are separated (singulated) along the singulation lines 114 to form individual semiconductor devices 600.

Advantageously, the present invention reduces or at least alleviates package stress at corner regions of the substrate sheet especially during the manufacturing and testing of the semiconductor die package. Also, the overhang 802 or slot 1002, when engaged with encapsulating material, reduces or at least alleviates the possibility of corners of the substrate sheet 102 from becoming detached from the encapsulating material 502.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
   a substantially rectangular substrate sheet having die mounting pads accessible from a first side and package mounting pads accessible from an opposite side, wherein each corner region of the substrate sheet has a receding edge;
   a semiconductor die attached to the substrate sheet, wherein electrodes of the die are mounted to respective ones of the die mounting pads of the substrate sheet; and
   an encapsulating material covering both the semiconductor die and the first side of the substrate sheet, wherein corner covering sections of the encapsulating material further cover the receding edges of each of the corner regions,
   wherein substrate sheet edges other than the receding edges are coplanar with a respective edge of the encapsulating material.

2. The semiconductor device of claim 1, wherein the receding edge forms a chamfered corner region.

3. The semiconductor device of claim 2, wherein in plan view the chamfered corner region is at a 45° angle to adjacent substrate sheet edges of the substrate sheet.

4. The semiconductor device of claim 1, wherein in plan view the receding edge has an arcuate profile.

5. The semiconductor device of claim 4, wherein the arcuate profile is concave.

6. The semiconductor device of claim 4, wherein the arcuate profile is convex.

7. The semiconductor device of claim 1, wherein in plan view the receding edge has a notched profile.

8. The semiconductor device of claim 1, wherein the receding edge has an overhang covered by a respective said corner covering section of the encapsulating material.

9. The semiconductor device of claim 8, wherein the overhang extends along a longitudinal axis of the receding edge.

10. The semiconductor device of claim 1, wherein the receding edge has a slot therein filled by a respective said corner covering section of the encapsulating material.

11. The semiconductor device of claim 10, wherein the slot extends along a longitudinal axis of the receding edge.

12. The semiconductor device of claim 1, wherein base regions of the corner covering sections are coplanar with the opposite side of the substrate sheet.

13. The semiconductor device of claim 1, wherein the substrate sheet includes interconnects that electrically connect the die electrodes to the package mounting pads by way of the die mounting pads.

14. The semiconductor device of claim 1, wherein the semiconductor device is a ball grid array package.

15. A method of assembling a semiconductor device, comprising:
- providing an apertured sheet including an array of substantially rectangular substrate sheets, each of the substrate sheets having a die mounting pad accessible from a first side and package mounting pads accessible from an opposite side, wherein adjacent corner regions of the substrate sheets have apertures therein that form corner region receding edges for each of the respective substrate sheets;
- attaching a respective semiconductor die to each of the substrate sheets, wherein electrodes of the semiconductor die are mounted to respective ones of the die mounting pads; and
- covering the semiconductor die and the first side of the substrate sheet with an encapsulating material, wherein the encapsulating material fills the apertures to provide corner covering sections that cover the receding edges of each of the corner regions.

16. The method of claim 15, further comprising separating the substrate sheets.

17. The method of claim 16, wherein substrate sheet edges other than the receding edges are coplanar with a respective edge of the encapsulating material.

18. The method of claim 16, wherein the receding edge has an overhang covered by a respective said corner covering section of the encapsulating material.

19. The method of claim 16, wherein the receding edge has a slot therein filled by a respective said corner covering section of the encapsulating material.

* * * * *